United States Patent
Li

(10) Patent No.: US 10,849,248 B2
(45) Date of Patent: Nov. 24, 2020

(54) CABLE BACKPLANE

(71) Applicant: NEW H3C TECHNOLOGIES CO., LTD., Hangzhou (CN)

(72) Inventor: Yi Li, Beijing (CN)

(73) Assignee: NEW H3C TECHNOLOGIES CO., LTD., Hangzhou (CN)

( * ) Notice: Subject to any disclaimer, the term of this patent is extended or adjusted under 35 U.S.C. 154(b) by 0 days.

(21) Appl. No.: 16/346,095

(22) PCT Filed: Oct. 31, 2017

(86) PCT No.: PCT/CN2017/108542
§ 371 (c)(1),
(2) Date: Apr. 29, 2019

(87) PCT Pub. No.: WO2018/077296
PCT Pub. Date: May 3, 2018

(65) Prior Publication Data
US 2019/0261532 A1   Aug. 22, 2019

(30) Foreign Application Priority Data
Oct. 31, 2016   (CN) .......................... 2016 1 0970797

(51) Int. Cl.
*H01R 12/00* (2006.01)
*H05K 7/14* (2006.01)
(Continued)

(52) U.S. Cl.
CPC .......... *H05K 7/1451* (2013.01); *H01R 13/518* (2013.01); *H01R 27/02* (2013.01);
(Continued)

(58) Field of Classification Search
CPC .. H05K 7/1451; H05K 7/1492; H05K 7/1452; H05K 7/10; H04Q 1/15;
(Continued)

(56) References Cited

U.S. PATENT DOCUMENTS 5,348,482 A * 9/1994 Rudy, Jr. .............. H05K 7/1412
361/725
2009/0120668 A1   5/2009 Fjelstad et al.
(Continued)

FOREIGN PATENT DOCUMENTS

CN   101984599 A   3/2011
CN   103050800 A   4/2013
(Continued)

OTHER PUBLICATIONS

ISA State Intellectual Property Office of the People's Republic of China, Written Opinion of the International Searching Authority Issued in Application No. PCT/CN2017/108542, dated Jan. 31, 2018, WIPO, 4 pages.
(Continued)

*Primary Examiner* — Abdullah A Riyami
*Assistant Examiner* — Nelson R. Burgos-Guntin
(74) *Attorney, Agent, or Firm* — McCoy Russell LLP

(57) ABSTRACT

Cable backplane systems and communication devices are provided according to examples of the present disclosure. In one aspect, a cable backplane system includes a frame and a cable unit; the cable unit includes a first connector array, a second connector array and communication cables; the first connector array is fixed on the frame, wherein a first connector in the first connector array is connected with a first plug-in card, first connectors in a same row are connected with a same first plug-in card; the second connector array is fixed on the frame, wherein a second connector in the second connector array is connected with a second plug-in card, second connectors in a same column are connected with a same second plug-in card; and the communication cables is connected with the first connector array and the second connector array.

9 Claims, 12 Drawing Sheets

(51) Int. Cl.
  *H01R 13/518* (2006.01)
  *H01R 33/90* (2006.01)
  *H05K 7/10* (2006.01)
  *H01R 31/06* (2006.01)
  *H01R 27/02* (2006.01)
  *H04Q 1/02* (2006.01)
  *H01R 12/75* (2011.01)

(52) U.S. Cl.
  CPC .............. *H01R 31/06* (2013.01); *H01R 33/90* (2013.01); *H04Q 1/15* (2013.01); *H05K 7/10* (2013.01); *H05K 7/1452* (2013.01); *H05K 7/1492* (2013.01); *H01R 12/75* (2013.01)

(58) Field of Classification Search
  CPC ........ H01R 27/02; H01R 31/06; H01R 33/90; H01R 13/518; H01R 12/75
  USPC .................................................. 439/61, 540.1
  See application file for complete search history.

(56) References Cited

U.S. PATENT DOCUMENTS

| | | | |
|---|---|---|---|
| 2011/0080719 A1* | 4/2011 | Jia ............................ | H05K 1/14 361/803 |
| 2012/0122335 A1* | 5/2012 | Costello ............... | H05K 7/1445 439/502 |
| 2013/0107489 A1 | 5/2013 | Wen et al. | |
| 2013/0217260 A1* | 8/2013 | Nichols .............. | H01R 13/6315 439/493 |
| 2014/0360753 A1 | 12/2014 | Sechrist et al. | |
| 2015/0162680 A1* | 6/2015 | Costello ............... | H01R 9/2408 439/64 |
| 2015/0194751 A1* | 7/2015 | Herring .................... | H04Q 1/15 439/78 |
| 2015/0200474 A1* | 7/2015 | Rossman ........... | H01R 12/7005 439/64 |
| 2016/0149362 A1* | 5/2016 | Ritter ...................... | H04Q 1/15 439/540.1 |
| 2017/0079155 A1 | 3/2017 | Zhang et al. | |

FOREIGN PATENT DOCUMENTS

| | | |
|---|---|---|
| CN | 104064893 A | 9/2014 |
| CN | 104244655 A | 12/2014 |
| CN | 104300303 A | 1/2015 |
| CN | 105024189 A | 11/2015 |
| CN | 105281917 A | 1/2016 |
| CN | 105990748 A | 10/2016 |
| EP | 3197112 A1 | 7/2017 |
| WO | 2015184951 A1 | 12/2015 |

OTHER PUBLICATIONS

State Intellectual Property Office of the People's Republic of China, Office Action and Search Report Issued in Application No. 201610970797.7, dated Aug. 20, 2019, 19 pages. (Submitted with Partial Translation).

European Patent Office, Extended European Search Report Issued in Application No. 17866278.9, dated Sep. 10, 2019, Germany, 7 pages.

ISA State Intellectual Property Office of the People's Republic of China, International Search Report Issued in Application No. PCT/CN2017/108542, dated Jan. 31, 2018, WIPO, 4 pages.

State Intellectual Property Office of the People's Republic of China, Office Action and Search Report Issued in Application No. 201610970797.7, dated Mar. 4, 2019, 12 pages. (Submitted with Partial English Translation).

State Intellectual Property Office of the People's Republic of China, Office Action and Search Report Issued in Application No. 201610970797.7, dated Dec. 16, 2019, 15 pages. (Submitted with Partial Translation).

Japanese Patent Office, Office Action Issued in Application No. 2019-522649, Aug. 18, 2020, 10 pages. (Submitted with Machine Translation).

* cited by examiner

US 10,849,248 B2

CABLE BACKPLANE

CROSS REFERENCE TO RELATED APPLICATIONS

This present application is a U.S. National Phase of International Patent Application Serial No. PCT/CN2017/108542 entitled "CABLE BACKBOARD," filed on Oct. 31, 2017. International Patent Application Serial No. PCT/CN2017/108542 claims priority to Chinese Patent Application No. 201610970797.7 filed on Oct. 31, 2016. The entire contents of each of the above-cited applications are hereby amended by reference for all purposes.

BACKGROUND

In communication devices, functions of plug-in cards (single boards) are desired to be clearly partitioned. In particular, plug-in cards with different functions are connected and communicate with each other through connectors to implement a complex communication system.

DETAILED DESCRIPTION OF THE EMBODIMENTS

A clear and complete description of the technical schemes in the examples of the present disclosure is made in conjunction with the accompanying drawings in the examples of the present disclosure. Obviously, the examples as recited herein are merely a part of examples of the present disclosure instead of all examples. All other examples obtained by a person of ordinary skill in the art based on the examples of the present disclosure without creative efforts shall fall within the protection scope of the present disclosure.

In a complex system, various modules (plug-in cards) may be designed according to requirements through a chassis on which a development module is pluggable. The plug-in cards may be connected with each other through a system backplane. As communication traffic of communication products is increasing, the number of the plug-in cards is correspondingly increased. When the system backplane is oversized, it is hard to control dimensions (widths and heights) for chassis of the communication products, which causes difficulties in system design.

Figure 1:
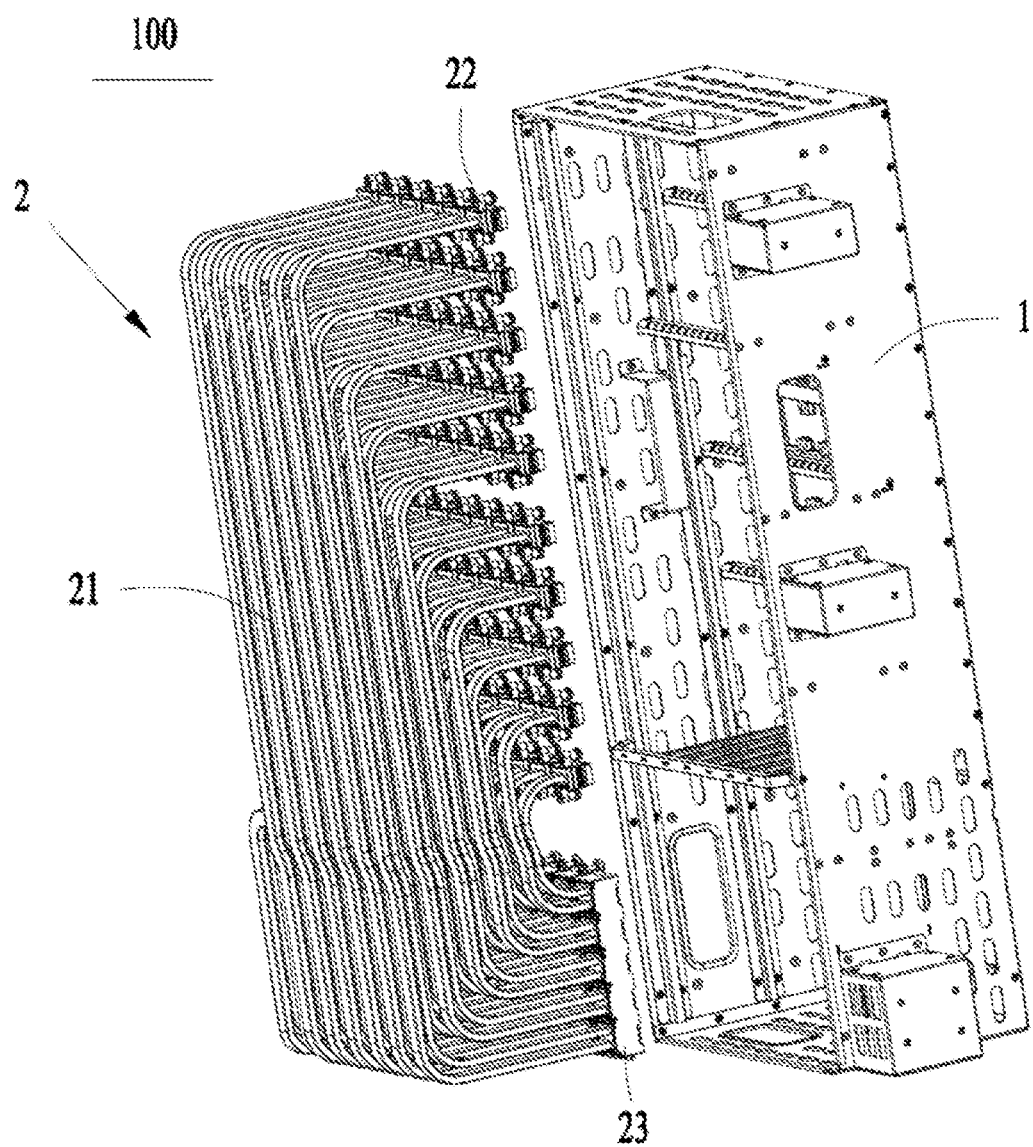
FIG. 1 is a schematic diagram illustrating a structure of a cable backplane system according to an example of the present disclosure.
Figure 2:
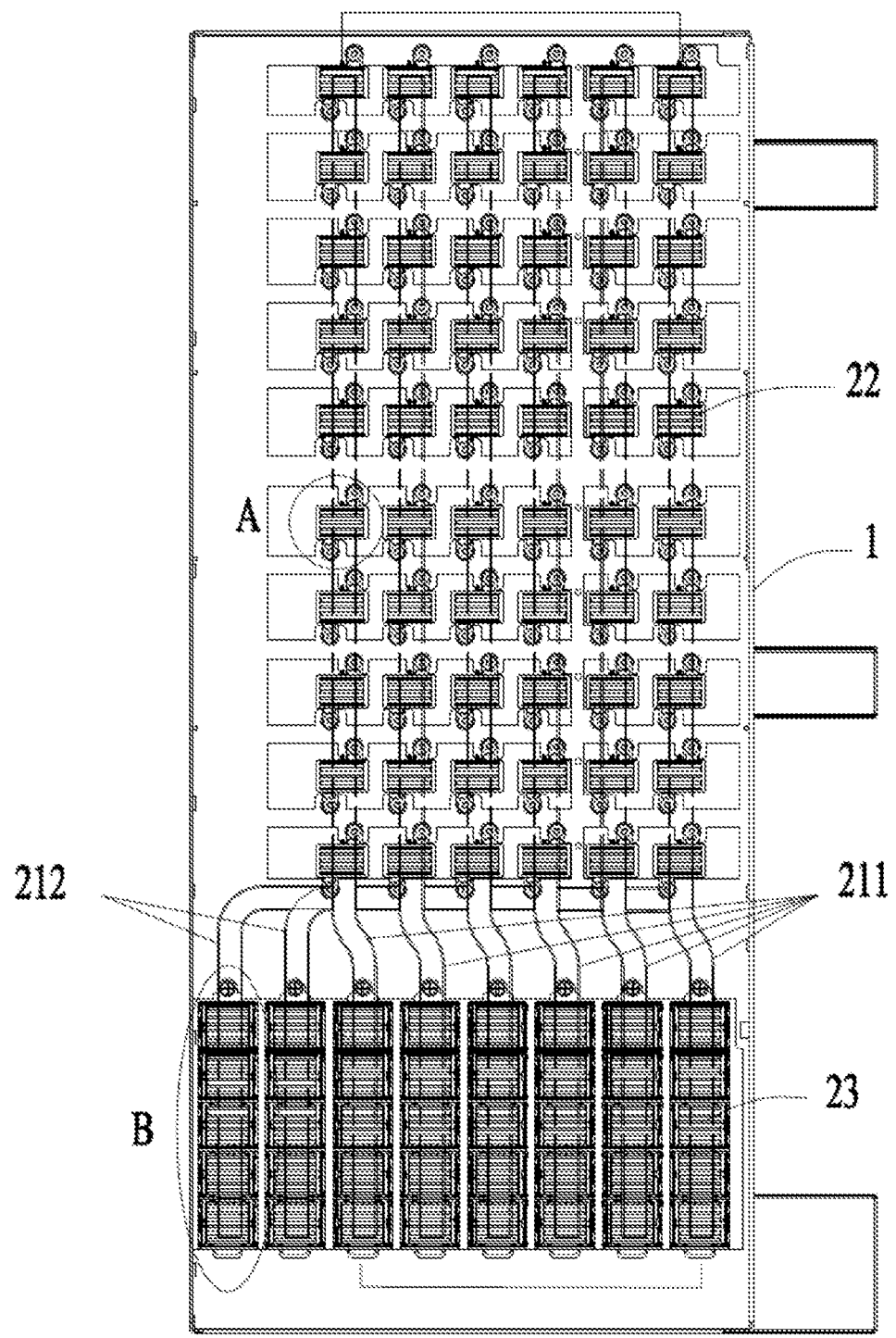
FIG. 2 is a plan view illustrating a cable backplane system according to an example of the present disclosure.

FIG. 1 is a schematic diagram illustrating a structure of a cable backplane system according to an example of the present disclosure. FIG. 2 is a plan view illustrating a cable backplane system according to an example of the present disclosure. In the example, the cable backplane system 100 includes a frame 1 and a cable unit 2. The cable unit 2 is fixed on the frame 1. The cable unit 2 includes a first connector array, a second connector array and communication cables 21. The first connector array is fixed on the frame 1. First connectors 22 in a same row of the first connector array are connected with a first plug-in card. The second connector array is fixed on the frame 1. Second connectors 23 in a same column of the second connector array are connected with a second plug-in card. The communication cables 21 are connected with the first connector array and the second connector array.

In an example of the present disclosure, the first connector array includes a plurality of first connectors regularly arranged in a transverse direction and a longitudinal direction. Likewise, the second connector array includes a plurality of second connectors regularly arranged in the transverse direction and the longitudinal direction. For example, the first connector array is a combination of 6×6 first connectors, and the second connector array is a combination of 6×6 second connectors. In an example of the present disclosure, each of the first connector array and the second connector array in a figure is a matrix. In another example of the present disclosure, based on space requirements for devices, the first connector array and the second connector array may be arrays with any regular or irregularly shapes.

In an example of the present disclosure, the first connectors 22 and the second connectors 23 are regularly or arbitrarily connected via the communication cables 21, so that communication between first plug-in cards and second plug-in cards is established based on connections via the communication cables 21. For example, connectors in the first plug-in card are arranged in a row, when the first plug-in cards are arranged in a transverse direction, each of the connectors on the first plug-in card is connected with a first connector 22 in a same row; connectors in the second plug-in card are arranged in a row, when the second plug-in cards are arranged in a longitudinal direction, each of the connectors on the second plug-in cards is connected with a second connector 23 in a same column. Each of the first plug-in cards is connected with a corresponding second plug-in card via the communication cables 21.

In an example, the first plug-in cards are service cards, and the second plug-in cards are switch cards, so that it is unnecessary to add switch cards when service cards are added onto the communication device based on service expansion requirements of users, and the communication device can be easily extended. Further, a signal integrity (SI)

performance problem for a high-speed link can be solved by a high-speed feature of the communication cables 21. In another example, the first plug-in cards are memory cards, and the second plug-in cards are network cards.

Figure 3:
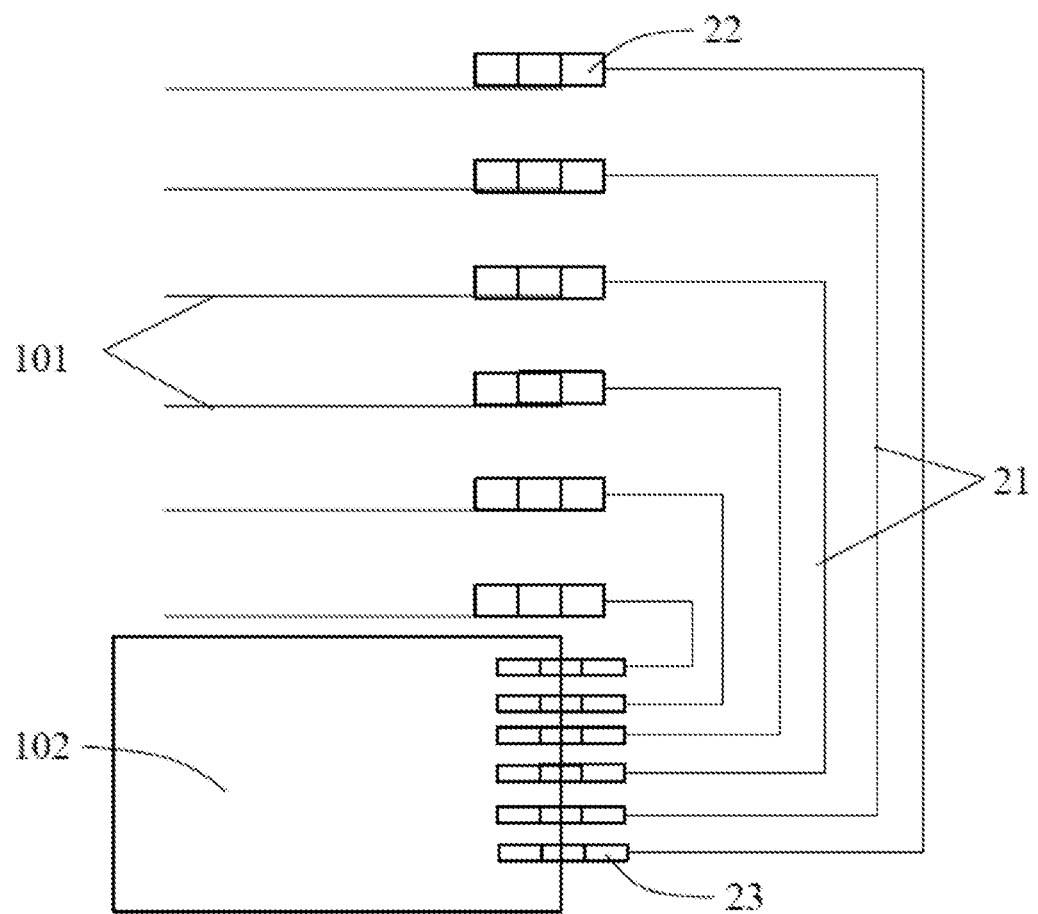
FIG. 3 is a side view illustrating a cable backplane system according to an example of the present disclosure.

In an example in FIG. 3, the number of columns of the second connector array is equal to the number of columns of the first connector array, and the number of the first connectors 22 in a column is equal to that of the second connectors 23 in the same column, so that the first connectors 22 are connected, one to one, to the second connectors 23 in the same column. In an example, in the first connector array and the second connector array, the first connectors and the second connectors in the same column are respectively connected one to one, which is helpful to determine a connection relation between first connector and second connector and further helpful for administrators to manage and maintain the communication cables.

The communication cables 21 include a plurality of cables. That is, the cables constitute the communication cables 21. The communication cables 21 are connected with the first connector array and the second connector array, and each of the cables is connected with a first connector and a second connector. In an example, between the first connectors 22 in the same column and the second connectors 23 in the same column, the first connectors 22 are sequentially connected with the second connectors 23 via the cables by taking a first connector and a second connector adjacent to each other as a starting point. For example, there are four rows of the first connectors 22 and four columns of the second connectors 23. The first connectors 22 in a column are denoted as 1~4 from top to bottom. The second connectors 23 in the same column are denoted as 5~8 from top to bottom. The No. 4 first connector 22 is connected with the No. 5 second connector 23. The No. 3 first connector 22 is connected with the No. 6 second connector 23. The No. 2 first connector 22 is connected with the No. 7 second connector 23. The No. 1 first connector 22 is connected with the No. 8 second connector 23. In the example, each of the cables is shaped like U as illustrated in FIG. 1. Thus, the cable unit 2 can be regularly arranged, and the communication cables 21 are provided with heat dissipating channels on a transverse direction and a longitudinal direction, which can avoid that the heat dissipating channels of the communication device are blocked by disorderly-arranged cables, and it is hard to manage communication devices (hard to tease out connection relations of connectors).

Figure 4:
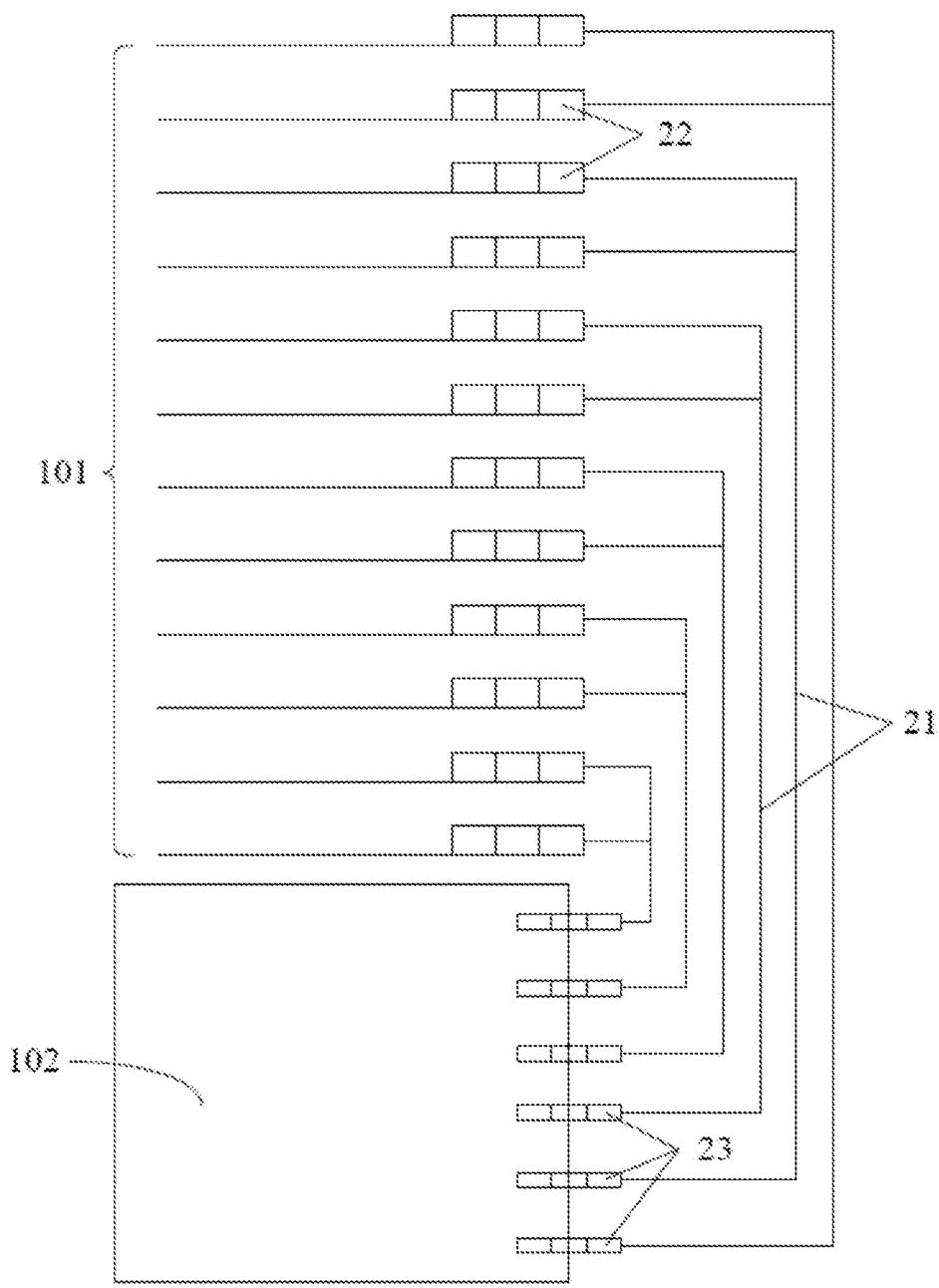
FIG. 4 is a side view illustrating a cable backplane system according to an example of the present disclosure.

In an example, the number of columns of the second connector array is equal to the number of columns of the first connector array. In a column, the number of the first connectors 22 is M times as many as the number of the second connectors 23, and M first connectors 22 are connected in parallel with a same second connector 23 via the communication cables 21, where M is a natural number more than 1. In an example, in FIG. 4, M is equal to 2.

In an example, the number of columns of the second connector array is equal to the number of columns of the first connector array. In a column, the number of the first connectors is different from the number of the second connectors. In this case, one first connector may be connected to a plurality of second connectors, or a plurality of first connectors may be connected to one second connector. In another example, the first connectors may be arbitrarily connected with the second connectors. For example, the first connectors corresponding to a plurality of first plug-in cards constitute a plurality of first connector groups. Each of the first connector groups may include a first connector in first connectors corresponding to each of the first plug-in cards. A plurality of first connectors in a same row in different first connector groups are different from each other. The first connectors in the first connector groups are connected, one to one, with the second connectors in same columns.

Figure 5:
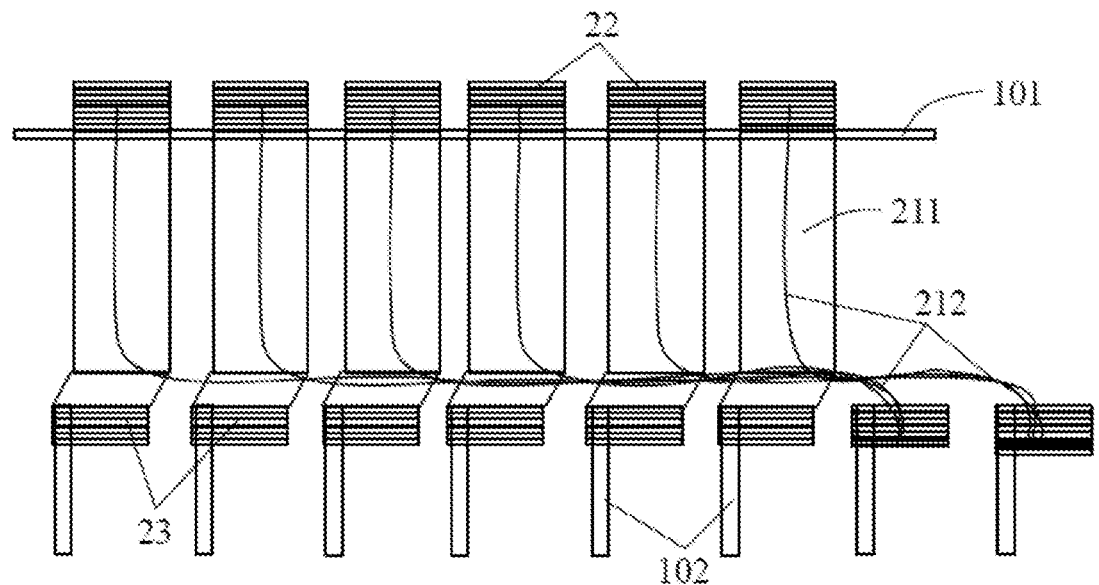
FIG. 5 is a schematic diagram illustrating that first connectors in a row are connected with second connectors in a row in a cable backplane system shown according to an example of the present disclosure.

In another example of the present disclosure in FIGS. 2 and 5, the number of columns of the second connector array is more than the number of columns of the first connector array. The second connector array includes base columns and extension columns, where the number of the base columns is equal to the number of the columns of the first connector array. Second connectors 23 on at least one extra column are connected with extended second plug-in cards 102 such that data processing can be accelerated, data processing capacity can be improved, and data exchange pressure can be alleviated for the second plug-in cards 102. In the example, the number of the second plug-in cards 102 may be increased or decreased according to the number of the desired first plug-in cards 101 such that system flexibility can be improved, and resource waste can be reduced.

Figure 6:
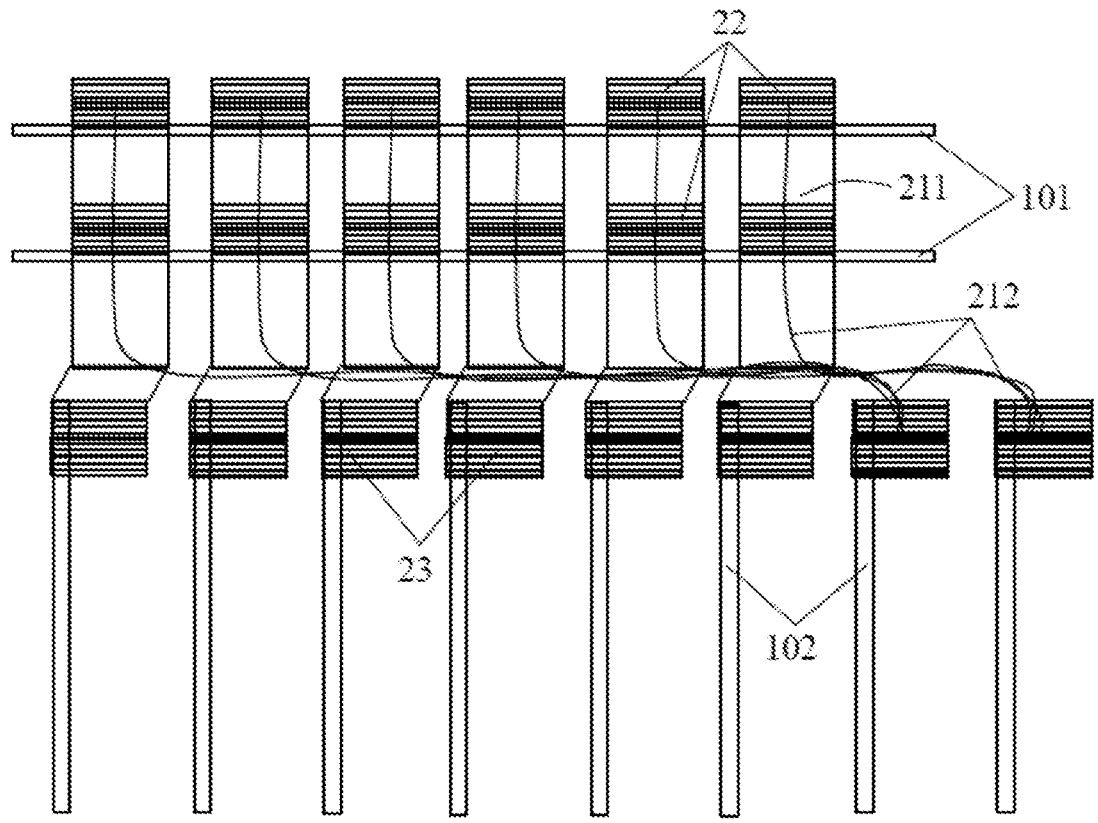
FIG. 6 is a schematic diagram illustrating in detail that first connectors in a row are connected with second connectors in a row in a cable backplane system shown according to an example of the present disclosure.

In an example, FIG. 6 is a profile chart illustrating a row of first connectors 22 and a row of second connectors 23. In FIG. 6, the number of the first connectors 22 is less than the number of the second connectors 23, and three first connectors 22 corresponds to four second connectors 23, which are taken as an example for description herein. The number of signal pins on a first connector 22 is more than the number of signal pins on a second connector 23. A part of the signal pins on the first connectors 22 are connected, one to one, with the signal pins on the second connectors 23 via signal lines in cables. Extra signal pins on each of the first connectors 22 in the row are connected with signal pins on the second connectors 22 in the extension columns via signal lines in the cables. Thus, signal can be completely sent between the first connectors 22 and the second connectors 23, and difficulty degree of completing the cable unit can be reduced. It is not limited in the present disclosure that the three first connectors 22 correspond to four second connectors 23. According to design requirements, the number of first connectors 22 and the number of second connectors 23 may be any values when it is satisfied that the signal pins on the first connectors 22 and the signal pins on the second connectors 23 are fit for connection with each other, and signals can intercommunicate with each other. In the case above, the number of the first connectors 22 may more than the number of the second connectors 23.

There may be some problem for the switch cards, e.g., the switch cards is overlarge in size, the switch cards is hard to be processed, the high-speed link of the switch cards is long, and it is hard for wiring on the switch cards. In an example of the present disclosure, the extension columns for the second connectors are added to reduce design difficulty of the switch cards (the second plug-in cards). For example, the number of the switch cards is equal to the number of the service cards, and eight chips are placed on each of the service cards. 48 chips in total are desired when six switch cards are designed. However, when the number of the switch cards is more than the number of the service cards (for example, eight switch cards), six chips are arranged on each of the switch cards to reach 48 chips in a way that the number of the chips on the switch cards is reduced, and it is easy to design the switch cards.

When the number of columns of the second connector array is more than the number of columns of the first connector array, the second connector array may be divided into base columns and extension columns. In the second connector array, the base columns include columns the number of which is same as the number of the columns of the first column array, the extension columns includes additional columns in the second connector array. In FIG. 2, there are six columns of the first connectors in the first connector array, and there are eight columns of the second connectors in the second connector array, where there are six base columns and two extension columns in the second connector array. It is not limited in examples of the present disclosure which columns are the base columns and which columns are the extension columns in the second connector array. In the example, the communication cables 21 are divided into a first cable group 211 and a second cable group 212, where each of the first cable group and the second cable group includes a plurality of cables. when the first connectors 22 in a row are respectively connected with the second connectors 23 in another row (i.e., a first plug-in card 101 is connected with each of second plug-in cards 102), the first connectors 22 are connected with the second connectors 23 in the base columns via the cables in the first cable group 211 and connected with the second connectors 23 in the extension columns via the cables in the second cable group 212. When the second connector 23 in a row does not correspond to any of the first connectors 22 in the row, the column including the second connector is the extension column. In the example, a first connector 22 is connected with an extended second connector 23 via a signal line in the communication cables 21 via which the first connectors 22 are connected with the second connectors 23, so as to increase the number of the second plug-in cards 102. According to the layout above for the communication cables 21, connections between connectors can be ensured to satisfy data interaction requirements, connection relations of connectors is clear, and heat dissipating channels are formed among cables in a same column.

Figure 7:
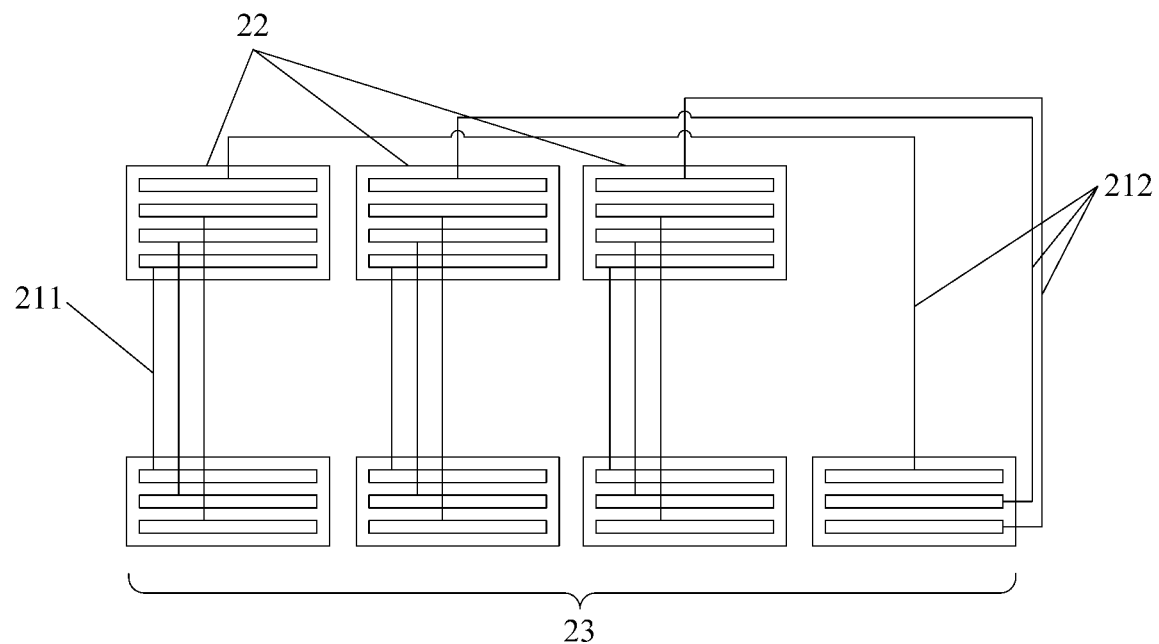
FIG. 7 is a schematic diagram illustrating that first connectors in two rows are connected with second connectors in a row according to an example of the present disclosure.

In FIGS. 2 and 7, to ensure that a communication device is configured with more first plug-in cards 101, first connectors 22 in at least two rows are connected in parallel with second connectors 23 in another row via the communication cables 21. In the example, when a plurality of first connectors are connected with a second connector, the number of the signal pin cables on the second connector is more than the number of the signal pins on the first connector, and a volume of the second connector is larger than a volume of the first connector in a way that signal transmission stability can be improved. In an example, different cables in the communication cables 21 are shaped like U in a way that there is no cross with each other. In the case above, the communication cables 21 are provided with the heat dissipating channels in the transverse direction and the longitudinal direction.

A spacing between two adjacent columns of the first connectors is larger than a spacing between two adjacent columns of the second connectors. The cables in the first cable group 211 are bent to be connected with the first connector array and the base columns in the second connector array. The cables in the second cable group 212 are bent to be connected with the first connector array and the extension columns in second connector array. In an example, the cables in the first cable group 211 are bent with a same first bending angle when the first connectors 22 connected with the cables in the first cable group 211 are in a same column, the second cable group 212 are bent with a same second bending angle when the second connectors 23 connected with the second cable group 212 are in a same column, so that the cables are regularly placed to facilitate management for the cables.

In another example, the first connectors 22 are connected with the second connectors 23 in any manner when it is satisfied that a first plug-in card is connected with each of second plug-in cards for communication, and a second plug-in card is connected with each of first plug-in cards for communication.

Figure 8:
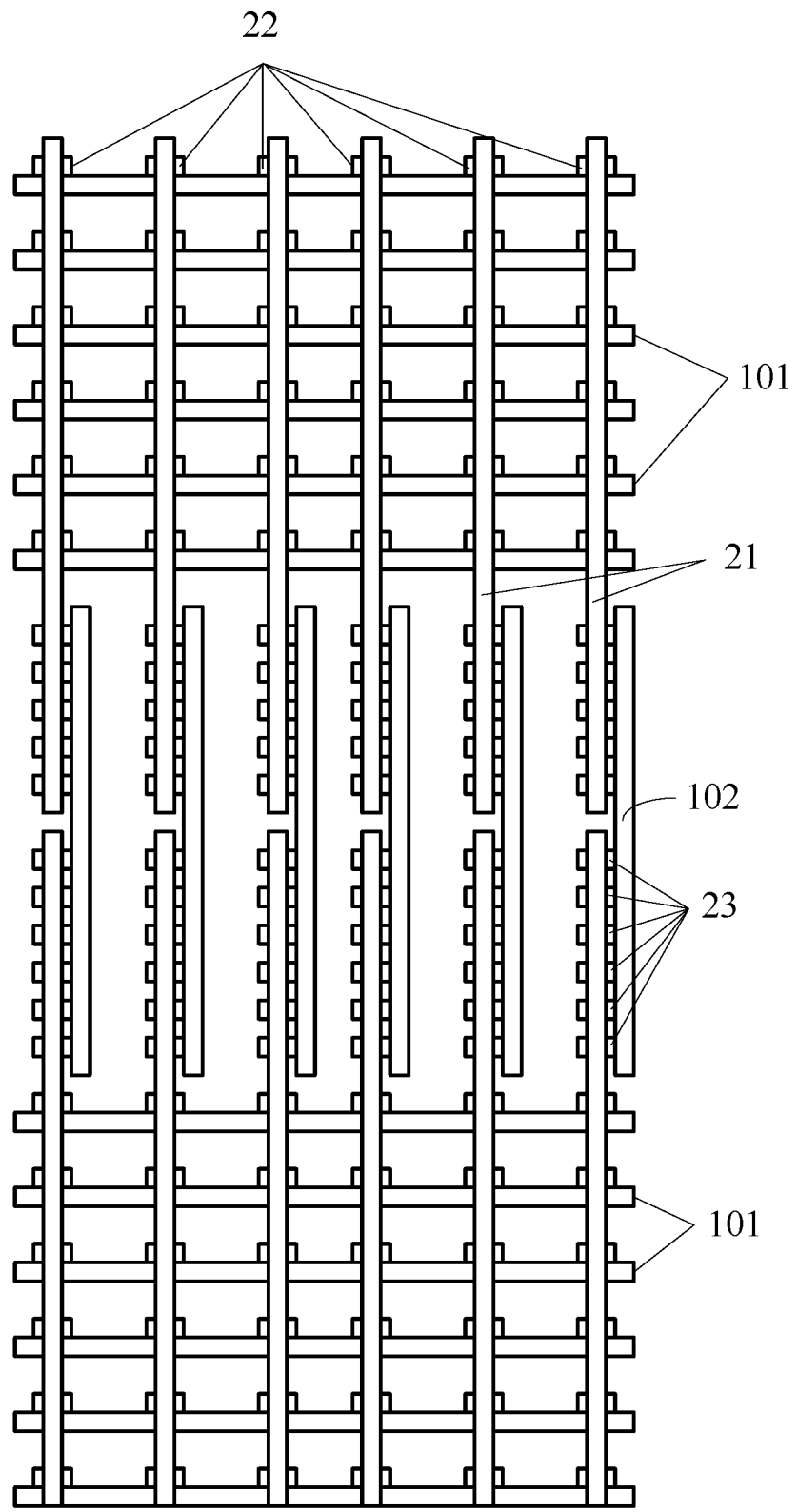
FIG. 8 is a plan view illustrating a cable backplane system according to an example of the present disclosure.
Figure 9:
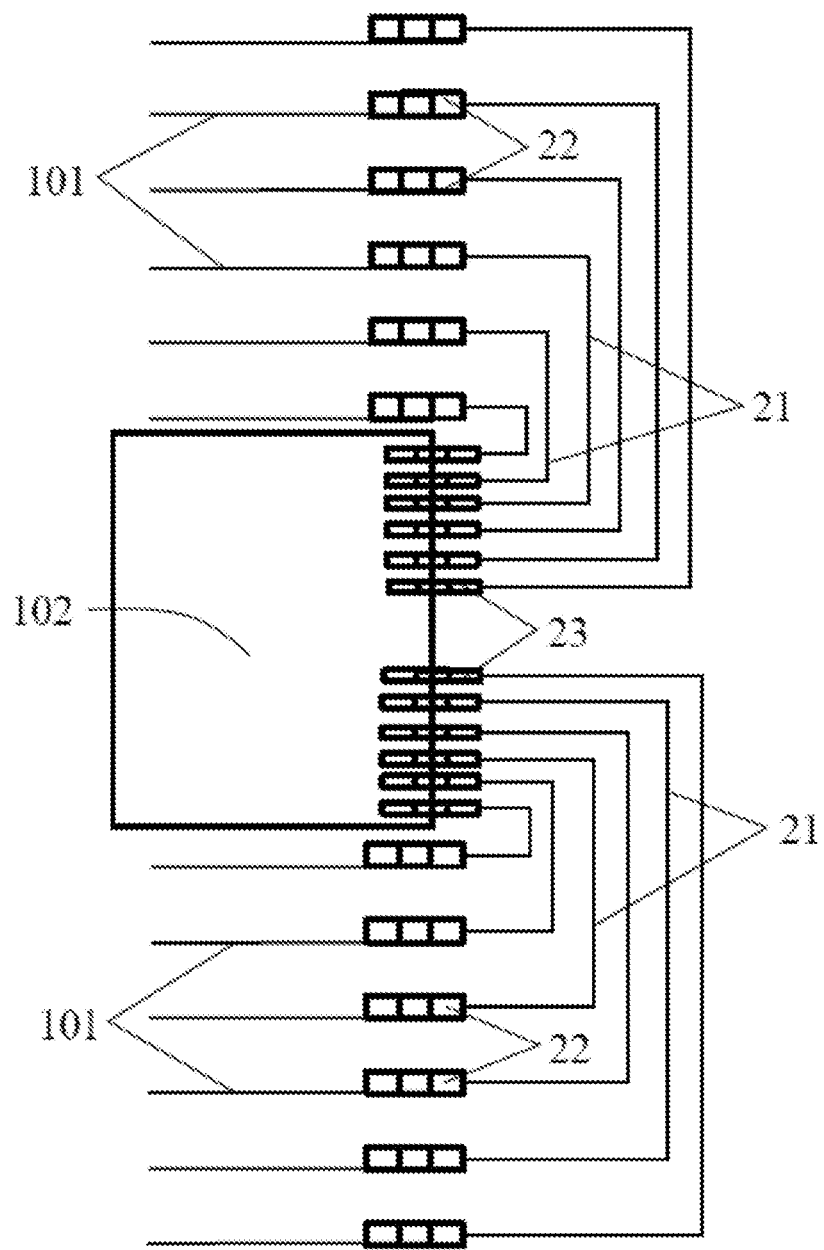
FIG. 9 is a side view of a cable backplane system illustrated in FIG. 8.
Figure 10:
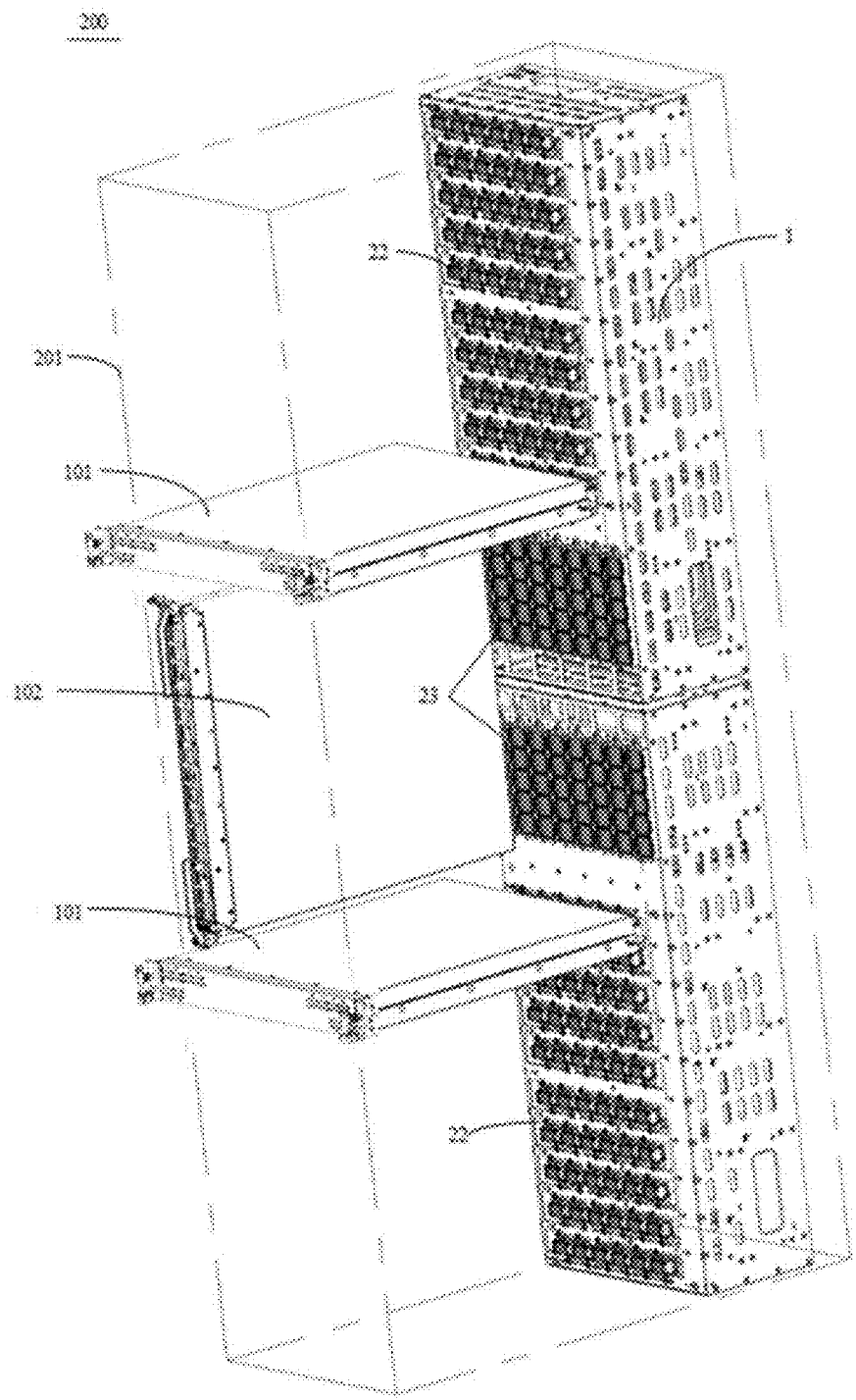
FIG. 10 is a schematic diagram illustrating a structure of a communication device according to an example of the present disclosure.

In FIGS. 8-10, in another example of the present disclosure, the cable backplane system 100 includes two first connector arrays. A second connector array is located between the two first connector arrays and connected with the two first connector arrays via the communication cables 21 respectively. The second connector array is further divided into two parts. The two parts of the second connector array are respectively connected with the two first connector arrays via the communication cables 21. For example, in FIG. 8, a first connector array 101_1 includes six rows, and another first connector array 101_2 also includes six rows. Each column of the second connector array between the first connector array 101_1 and 101_2 includes twelve second connectors 23. Six second connectors 23 in top of the column are connected, one to one, with the first connectors 22 in the first connector array 101_1 in the same column. Six second connectors 23 in bottom of the column are connected, one to one, with the first connectors 22 in the first connector array 101_2 in the same column.

Figure 11:
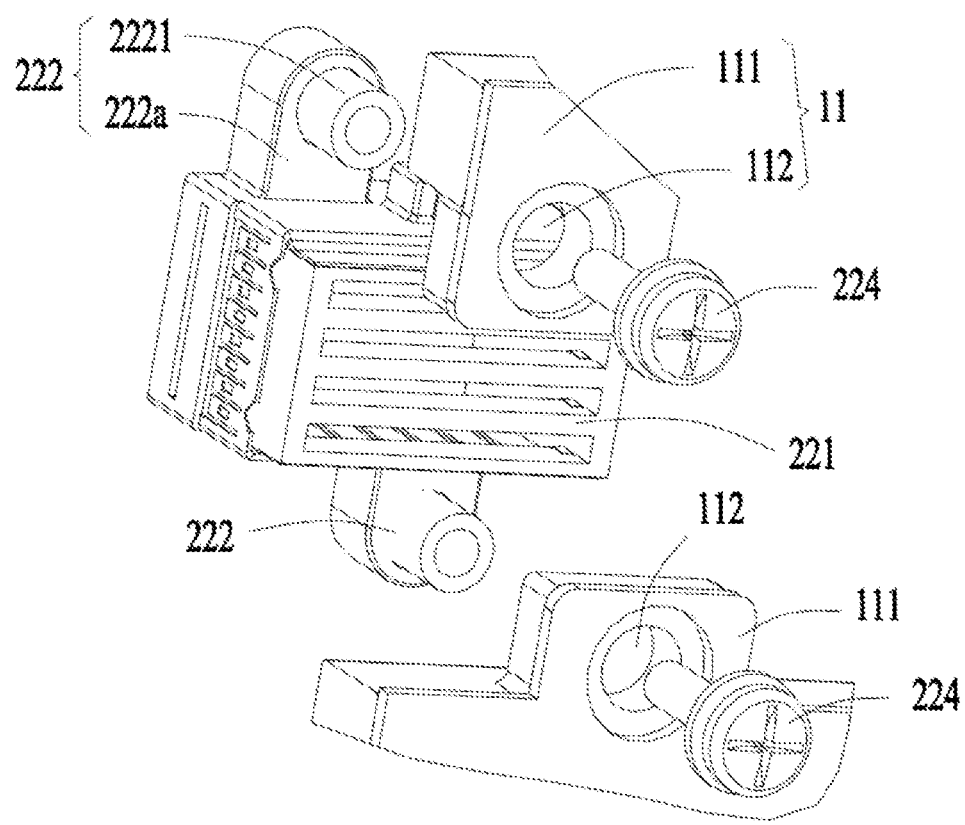
FIG. 11 is an enlarged view illustrating a part A in FIG. 2.

In an example in FIGS. 10 and 11, the frame 1 includes a first component 11 to be cooperatively connected with a first connector. The cable unit is cooperatively connected with the first component 11 via the first connector 22 in a way that the cable unit is fixed on the frame 1. In the example, the first component 11 may be integrally-molded with a main body of the structural frame, or may be fixed on the main body of the frame via bolts or rivets.

The first component 11 includes a main body of the first component 111 and a connecting hole 112 on the main body of the first component 111, where the connecting hole 112 is used to be connected with the first connector 22. In another example, the connecting hole 112 is another structure cooperatively connected with the first connector 22, for example, a connecting part or a clamping structure, etc.

The first connector 22 includes a main body of the first component 221 and a convex platform 222 which respectively extends from upside and downside of the main body of the first connector 221. The convex platform 222 cooperates with the connecting hole 112 in a way that the first connector 22 is connected with the first component 11. In an example, the convex platform 222 is fixed in the connecting hole 112.

In an example in FIGS. 10 and 11, the convex platform 222 includes a substrate 222a, and a stud 2221 arranged on the substrate 222a. The first component 11 further includes a screw 224 cooperating with the connecting hole 112 in a way that the screw 224 is cooperatively connected with the stud 2221. The stud 2221 is fixed with the screw 224 directly by passing through the connecting hole 112 on the first component 11 in a way that the first component 11 is clamped by the screw 224 and the convex platform 222 of the first connector 22 to be connected with the first connector 22.

A height of the stud 2221 is larger than a depth of the connecting hole 112. That is, the height of the stud 2221 is larger than a material thickness of the first component 11 in a way that the first connector 22 can move in a direction opposite to the first component 11, i.e., a floating quantity is designed for the first connector 22 to absorb structural tolerance. In an example, the floating quantity of the first connector 22 in the direction opposite to the first component 11 is adjusted by changing the material thickness of the first component 11.

Further, an external diameter of the stud 2221 is smaller than a diameter of the connecting hole 112 in a way that gap cooperation is implemented through a difference value between the diameter of the connecting hole 112 and an axis diameter of the stud 2221, and the first connector 22 can provide the floating quantity for the stud 2221 in a radial direction. In an example, when design for the floating quantity of the first connector 22 is determined to be unreasonable, the diameter of the connecting hole 112 on the first component 11 is directly changed to adjust the floating quantity, rather than that the first connector 22 is changed, which can make implementation easer compared with changing the first connector 22.

Figure 12:
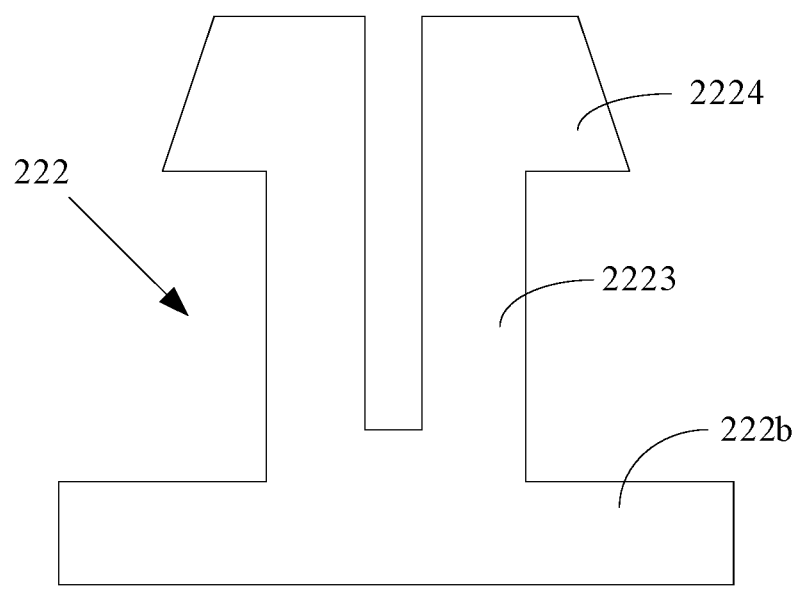
FIG. 12 is a schematic diagram of a structure of a boss according to an example of the present disclosure.

In another example in FIG. 12, the convex platform 222 includes a substrate 222b, a protrusion 2223 arranged on the substrate 222b, and a limiting part 2224 arranged at a free end of the protrusion 2223, where the protrusion 2223 is arranged to be hollow. An external diameter of the protrusion 2223 is smaller than the diameter of the connecting hole. An external diameter of the limiting part 2224 is larger than the diameter of the connecting hole. In the example, the protrusion 2223 is arranged to be hollow in a way that the protrusion 2223 has elasticity. When the protrusion 2223 is assembled to the first component 11, the free end of the protrusion 2223 is compressed by an external force to make the limiting part 2224 limited until the limiting part 2224 passes through the connecting hole 112. The external force is removed when the limiting part 2224 passes through the connecting hole 112. The limiting part 2224 recovers to an original state based on an elastic force in a way that the first component is limited between the limiting part 2224 and the substrate 222b, and assembly for the first connector 22 and the first component 11 is completed.

In the example, the limiting part 2224 may be an inverse ratchet in a way that a circumferential side of the limiting part 2224 has a guidance inclined plane, and the first connector can easily be plugged into the first component 11 to make assembly easy. The external diameter of the protrusion 2223 is smaller than the diameter of the connecting hole in a way that gap cooperation is implemented through a difference value between the diameter of the connecting hole 112 and an external diameter of the protrusion 2223, and the first connector 22 can provide floating quantity for the protrusion 2223 in a radial direction. Further, a floating quantity is designed for the first connector 22 in an axis direction to absorb structural tolerance.

Figure 13:
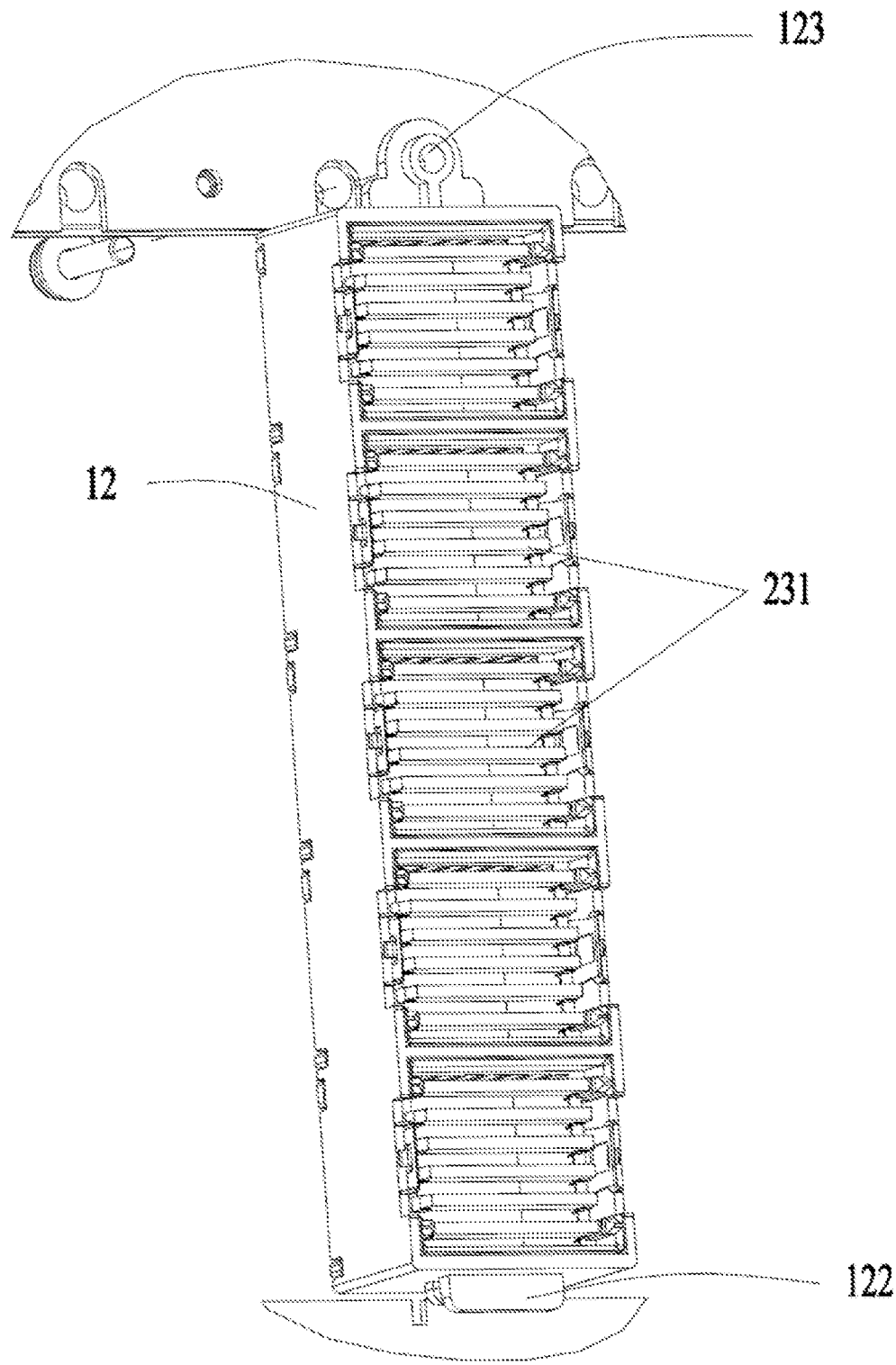
FIG. 13 is an enlarged view illustrating a part B in FIG. 2.
Figure 14:
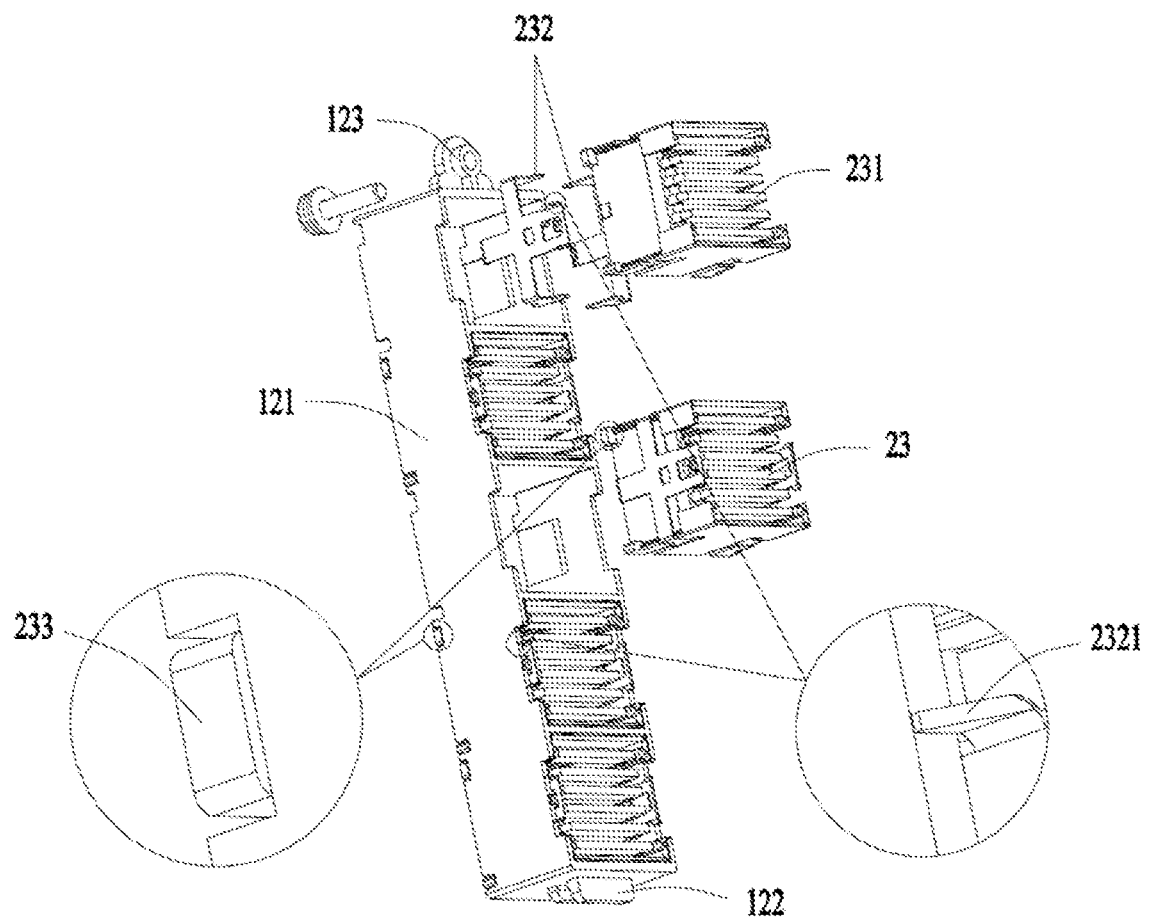
FIG. 14 is an exploded view illustrating a part B in FIG. 2.

In FIGS. 2, 13 and 14, the frame 1 further includes a second component 12 cooperatively connected with second connectors 23. The cable unit is cooperatively connected with the second component 12 through the second connector 23 in a way that the cable unit is fixed on the frame 1. The second component 12 includes a metal housing 121, a clamping part 122 arranged at a side of the metal housing 121, and a connecting part 123 arranged at another side of the metal housing 121, where the connecting part 123 and the clamping part 122 are respectively located at two opposite sides of the metal housing 121. The second connector 23 is fixed on the main body of the frame through the metal housing 121. In an example, the second component 12 is cooperatively clamped with the main body of the frame 1 through the clamping part 122, and is fixed on the main body of the frame 1 through the connecting part 123. Thus, assembly space for the second connector 23 on the frame 1 can be saved, and a plurality of second connectors 23 can be assembled through a connecting part 123 and a clamping part 122. In an example, a bolt is used as the connecting part 123.

A plurality of second connectors 23 are assembled in accommodation space of the metal housing 121. The second connectors 23 fixed into the metal housing 121 are cooperatively plugged into the same second component. The second connector 23 includes a main body of the second connector 231, an elastic slice 232 cooperatively clamped on the main body of the second connector 231, and a protrusion part 233 arranged at a bottom of the main body of the second connector 231. A gap is provided between the main body of the second connector 231 and the accommodation space. The main body of the second connector 231 is cooperatively clamped in the gap through the elastic slice 232 in a way that the main body of the second connector 231 is fixed on the metal housing 121. The main body of the second connector 231 has a floating quantity relative to the metal housing 121 based on elastic attributes of the elastic slice 232.

Further, the elastic slice 232 includes a limiting part 2321 bending outward and extending out. When the second connector 23 is mounted in the accommodation space of the metal housing 121, the protrusion part 233 is cooperated with a slot in the metal housing 121, and limiting part 2321 presses against an upper-end surface of the metal housing 121. Based on the a feature of the protrusion part 233 and a feature of the limiting part 2321, the second connector 23 can provide location limit between the main body of second connector 231 and the metal housing 121 in an assembly direction, further there is a floating quantity in the assembly direction.

In the example, the main body of the second connector includes a shell enclosed to be a frame structure and a plurality of elastic slide pins arranged in the shell. In an example, the elastic piece pins are arranged in parallel. When a plurality of the first connectors are connected with a second connector, the number of the elastic piece pins on the first connector is smaller than the number of the elastic piece pins on the second connector, and a volume of the second connector is larger than a volume of the first connector.

In examples of the present disclosure, a cable backplane system 100 is designed such that backplane design complexity can be simplified, and increased communication traffic can be satisfied. Further, a SI performance problem for a high-speed link in the cable backplane system 100 can be solved by a high-speed feature of the communication cables 21. By using the cable backplane system 100, dimension of the backplane system can be reduced, the first plug-in cards can extend.

According to examples of the present disclosure, a communication device 200 is provided. In an example in FIG. 10, the communication device includes a device chassis 201, a cable backplane system as described above, a plurality of first plug-in cards 101 and a plurality of second plug-in cards 102. A first plug-in card 101 is connected with first connectors in a same row on the cable backplane system. A second plug-in card is connected with second connectors in a same column on the cable backplane system.

In the cable backplane system 100, the frame 1 may be fixed on the device chassis 201 in a way that the whole cable backplane system 100 is fixed on the device chassis 201. Alternatively, the frame 1 may be a part of the device chassis 201, which is integrally-molded with the device chassis 201.

In an example, connectors on the first plug-in card 101 are arranged in a row, and connectors on the second plug-in card 102 are arranged in a row. When the first plug-in card 101 and the second plug-in card 102 are respectively connected with the first connector array and the second connector array, the connectors on the first plug-in card 101 are cooperatively plugged into first connectors 22 in a row of the first connector array, and the connectors on the second plug-in card 102 are cooperatively plugged into second connectors 23 in a column of the second connector array. In an example of the present disclosure, the first plug-in card 101 is a service card, the second plug-in card 102 is a switch card, and a plurality of service cards may communicate with each other via a plurality of switch cards.

In an example in FIGS. 8-10, based on layout of the first connector array and the second connector array in the cable backplane system 100, a plurality of first plug-in cards 101 are divided into two groups, second plug-in cards 102 are located between the two groups of first plug-in cards 101. The second plug-in cards 102 are respectively connected with the two groups of the first plug-in cards 101 via the cable backplane system 100. In the example, the second plug-in cards 102 in the communication device are separately connected with the two groups of the first plug-in cards 101. The two groups of the first plug-in cards 101 can perform information interaction with each other via the second plug-in cards 102. The second plug-in cards 102 are in the middle in a way that lengths of cables in the cable unit 2 can be shorten.

In an example in FIGS. 2-7, the first plug-in cards 101 are located above the second plug-in cards 102. The number of the first plug-in cards 101 is N times as many as the number of the connectors on the second plug-in cards 102, and the connectors on N first plug-in cards 101 in a same column are connected with the connectors on a corresponding second plug-in card 102 via the cable unit 2 in the cable backplane system 100, wherein N is a natural number greater than 1. Thus, dimension of the communication device can be significantly reduced, and more first plug-in cards 101 can be configured, thereby improving service processing capacity for the communication device.

Further, the communication device may increase the second plug-in cards 102 by increasing columns of the second connector array in a way that the service processing capacity of the communication device can be improved, service processing speed can be increased, and it can be satisfied that the communication device is configure with more first plug-in cards 101.

Cable backplane systems and communication devices are provided according to examples of the present disclosure. High-speed cables can be used to be connected with service cards and switch cards in a way that data interaction speed can be improved. Based on the layout of the cable unit, flexible configuration for the cable backplane system can be implemented, and a plurality of configuration requirement for the service cards and the switch cards can be satisfied. Further, the communication device provided with the cable backplane system has strong service processing capacity and enhanced extendibility in a way that configuration requirements of users for the service cards and the switch cards can be satisfied, and market competitiveness can be improved.

Apparatus examples are basically corresponding to the method examples, and thus method examples can serve as reference. Apparatus examples set forth above are merely exemplary, wherein units described as detached parts can be or not be detachable physically; parts displayed as units can be or not be physical units, i.e., either located at the same place, or distributed on a plurality of network units. Modules may be selected in part or in whole according to actual needs to achieve objectives of the solution of this example. Those of ordinary skill in the art may comprehend and implement the example without contributing creative effort.

It is to be noted that a relational term (such as a first or a second . . . ) herein is merely intended to separate one entity or operation from another entity or operation instead of requiring or hinting any practical relation or sequence exists among these entities or operations. Furthermore, terms such as "comprise", "include" or other variants thereof are intended to cover a non-exclusive "comprise" so that a process, a method, a merchandise or a device comprising a series of elements not only includes these elements, but also includes other elements not listed explicitly, or also includes inherent elements of the process, the method, the merchandise or the device. In the case of no more restrictions, elements restricted by a sentence "may include a . . . " do not exclude the fact that additional identical elements may exist in a process, a method, a merchandise or a device of these elements.

The above describes in detail the method and the apparatus provided by the examples of the present disclosure, elaboration of principles and implementations of the present disclosure is made by using specific examples herein, and the description of the foregoing examples is merely intended to assist in understanding the method of the present disclosure and the core concept thereof; also, those of ordinary skill in the art may change, in according with the concept of the present disclosure, a concrete implementation and a scope of application. In conclusion, contents of the specification shall be not interpreted as limiting the present disclosure.

The invention claimed is:

1. A cable backplane system, comprising:
a frame; and a cable unit, comprising:
a first connector array, fixed on the frame, wherein a first connector in the first connector array is connected with a first plug-in card, and first connectors in a same row are connected with a same first plug-in card; and
a second connector array, fixed on the frame, wherein a second connector in the second connector array is connected with a second plug-in card, and second connectors in a same column are connected with a same second plug-in card; and communication cables, connected with the first connector array and the second connector array,
wherein the second connector array comprises base columns and extension columns, a number of base columns in the second connector array is equal to a number of base columns of the first connector array, the communication cables comprise a first cable group and a second cable group, when first connectors in a row are respectively connected with second connectors in another row, the first connectors are connected with second connectors in the base columns via the communication cables in the first cable group and connected with second connectors in the extension columns via the communication cables in the second cable group.

2. The cable backplane system according to claim 1, wherein first connectors in at least two rows are connected in parallel with second connectors in another row via the communication cables.

3. The cable backplane system according to claim 1, wherein a spacing between two adjacent columns of the first connectors is larger than a spacing between two adjacent columns of the second connectors.

4. The cable backplane system according to claim 1, wherein the cable backplane system comprises two first connector arrays, the second connector array is located between the two first connector arrays and connected with the two first connector arrays via the communication cables.

5. A communication device, comprising:
a device chassis, a cable backplane system, and a plurality of first plug-in cards and second plug-in cards; wherein a first plug-in card is connected with first connectors in a same row on the cable backplane system, and a second plug-in card is connected with second connectors in a same column on the cable backplane system; the cable backplane system comprises:
a frame; and a cable unit, comprising:
a first connector array, fixed on the frame; and
a second connector array, fixed on the frame; and communication cables, connected with the first connector array and the second connector array, wherein the second connector array comprises base columns and extension columns, a number of base columns of the second connector array is equal to a number of columns of the first connector array, the communication cables comprise a first cable group and a second cable group, when first connectors in a row are respectively connected with second connectors in another row, the first connectors are connected with second connectors in the base columns via the communication cables in the first cable group and connected with second connectors in the extension columns via the communication cables in the second cable group.

6. The communication device according to claim 5, wherein the plurality of first plug-in cards are divided into two groups, the plurality of second plug-in cards are located between the two groups of the plurality of first plug-in cards, wherein the plurality of second plug-in cards are respectively connected with the two groups of the first plug-in cards via two cable backplane systems.

7. The communication device according to claim 5, wherein the plurality of first plug-in cards are service cards, and the plurality of second plug-in cards are switch cards.

8. The communication device according to claim 5, wherein first connectors in at least two rows are connected in parallel with second connectors in another row via the communication cables.

9. The communication device according to claim 5, wherein a spacing between two adjacent columns of the first connectors is larger than a spacing between two adjacent columns of the second connectors.

* * * * *